(12) United States Patent
Melzer et al.

(10) Patent No.: US 7,196,841 B2
(45) Date of Patent: Mar. 27, 2007

(54) LIGHTING SYSTEM, PARTICULARLY FOR USE IN EXTREME ULTRAVIOLET (EUV) LITHOGRAPHY

(75) Inventors: Frank Melzer, Utzmemmingen (DE); Wolfgang Singer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 108 days.

(21) Appl. No.: 10/512,100

(22) PCT Filed: Apr. 8, 2003

(86) PCT No.: PCT/EP03/03616

§ 371 (c)(1),
(2), (4) Date: Oct. 21, 2004

(87) PCT Pub. No.: WO03/093902

PCT Pub. Date: Nov. 13, 2003

(65) Prior Publication Data

US 2005/0174650 A1    Aug. 11, 2005

(30) Foreign Application Priority Data

Apr. 30, 2002   (DE) ................. 102 19 514

(51) Int. Cl.
- *G02B 5/08* (2006.01)
- *G02B 26/00* (2006.01)
- *G02B 26/08* (2006.01)
- *G03B 27/54* (2006.01)
- *A61N 5/00* (2006.01)
- *G21K 5/00* (2006.01)

(52) U.S. Cl. .............. 359/351; 359/290; 359/291; 359/850; 359/857; 359/298; 378/34; 378/145; 355/53; 355/67; 250/492.2; 250/504 R

(58) Field of Classification Search ........... 359/290, 359/291, 295, 298, 351, 357, 850, 570, 572, 359/851, 856, 857; 378/34, 84, 145, 146, 378/35; 250/492.2, 504 R; 355/53, 67, 355/68, 69; 385/15–19; 430/311, 966
See application file for complete search history.

(56) References Cited

U.S. PATENT DOCUMENTS

| | | |
|---|---|---|
| 3,077,958 A | 2/1963 | Grimsey |
| 3,802,781 A | 4/1974 | Wright |
| 3,837,125 A | 9/1974 | Johnson |
| 3,879,105 A | 4/1975 | Broche et al. |
| 3,917,385 A | 11/1975 | Caswell |
| 4,038,971 A | 8/1977 | Bezborodko |
| 4,060,315 A | 11/1977 | Heinz |
| 4,092,518 A | 5/1978 | Merard |
| 4,162,120 A | 7/1979 | Moreno |
| 4,195,913 A | 4/1980 | Dourte et al. |
| 4,202,605 A | 5/1980 | Heinz |
| 4,226,507 A | 10/1980 | Fuschetto |
| 4,236,296 A | 12/1980 | Woolhouse et al. |
| 4,277,141 A | 7/1981 | Kleiber |
| 4,295,710 A | 10/1981 | Heinz |
| 4,348,090 A | 9/1982 | Iizuka |
| 4,380,391 A | 4/1983 | Buser et al. |
| 4,389,115 A | 6/1983 | Richter |
| 4,403,421 A | 9/1983 | Shepherd |
| 4,408,874 A | 10/1983 | Zinky et al. |
| 4,659,225 A | 4/1987 | Takahashi |
| 4,672,439 A | 6/1987 | Florence et al. |
| 4,674,874 A | 6/1987 | Halldorsson et al. |
| 4,705,369 A | 11/1987 | Humpal |
| 4,710,276 A | 12/1987 | Kull |
| 4,722,592 A | 2/1988 | Stolfi |
| 4,740,276 A | 4/1988 | Marmo et al. |
| 4,826,304 A | 5/1989 | Guch et al. |
| 4,849,668 A | 7/1989 | Crawley et al. |
| 4,865,454 A | 9/1989 | Lazzarini et al. |
| 4,871,237 A | 10/1989 | Anzai et al. |
| 4,932,770 A | 6/1990 | Caravaty |
| 4,932,778 A | 6/1990 | Parra |
| 4,953,965 A | 9/1990 | Iwase et al. |
| 4,959,531 A | 9/1990 | Marino |
| 4,967,088 A | 10/1990 | Stengl et al. |
| 4,969,726 A | 11/1990 | Koning |
| 5,025,284 A | 6/1991 | Komoriya et al. |

| | | |
|---|---|---|
| 5,026,977 A | 6/1991 | Hubbard, Jr. |
| 5,074,654 A | 12/1991 | Alden et al. |
| 5,079,414 A | 1/1992 | Martin |
| 5,132,979 A | 7/1992 | Erbert |
| 5,157,555 A | 10/1992 | Reno |
| 5,204,712 A | 4/1993 | Bouwer et al. |
| 5,210,650 A | 5/1993 | O'Brien et al. |
| 5,339,346 A | 8/1994 | White |
| 5,339,720 A | 8/1994 | Pellarin et al. |
| 5,361,292 A | 11/1994 | Sweatt |
| 5,400,184 A | 3/1995 | Kuklo |
| 5,414,557 A | 5/1995 | Phillips |
| 5,428,482 A | 6/1995 | Bruning et al. |
| 5,438,451 A | 8/1995 | Schweizer |
| 5,485,053 A | 1/1996 | Baz |
| 5,529,277 A | 6/1996 | Ostaszewski |
| 5,537,262 A | 7/1996 | Aoki et al. |
| 5,581,605 A | 12/1996 | Murakami et al. |
| 5,642,237 A | 6/1997 | Miyawaki et al. |
| 5,694,257 A | 12/1997 | Arnone et al. |
| 5,719,846 A | 2/1998 | Matoba et al. |
| 5,724,017 A | 3/1998 | Pla et al. |
| 5,737,137 A | 4/1998 | Cohen et al. |
| 5,784,355 A | 7/1998 | Abe |
| 5,870,133 A | 2/1999 | Naiki |
| 5,891,317 A | 4/1999 | Teichmann et al. |
| 5,986,795 A | 11/1999 | Chapman et al. |
| 5,986,827 A | 11/1999 | Hale |
| 6,033,079 A * | 3/2000 | Hudyma .................. 359/857 |
| 6,054,784 A | 4/2000 | Sperling et al. |
| 6,108,121 A | 8/2000 | Mansell et al. |
| 6,118,577 A * | 9/2000 | Sweatt et al. ............... 359/351 |
| 6,144,511 A | 11/2000 | Umetsu et al. |
| 6,160,628 A | 12/2000 | Inoue |
| 6,166,868 A | 12/2000 | Holderer et al. |
| 6,195,201 B1 | 2/2001 | Koch et al. |
| 6,208,407 B1 | 3/2001 | Loopstra |
| 6,210,865 B1 * | 4/2001 | Sweatt et al. ............... 430/311 |
| 6,225,027 B1 * | 5/2001 | Replogle et al. ............ 430/311 |
| 6,229,657 B1 | 5/2001 | Holderer et al. |
| 6,246,822 B1 | 6/2001 | Kim et al. |
| 6,252,334 B1 | 6/2001 | Nye et al. |
| 6,252,648 B1 | 6/2001 | Hase et al. |
| 6,252,712 B1 | 6/2001 | Furter et al. |
| 6,259,571 B1 | 7/2001 | Holderer et al. |
| 6,275,344 B1 | 8/2001 | Holderer |
| 6,290,363 B1 | 9/2001 | Masutani |
| 6,296,811 B1 | 10/2001 | Sasaki |
| 6,307,688 B1 | 10/2001 | Merz et al. |
| 6,337,484 B1 | 1/2002 | Loopstra et al. |
| 6,341,006 B1 | 1/2002 | Murayama et al. |
| 6,369,959 B1 | 4/2002 | Trunz et al. |
| 6,373,552 B1 | 4/2002 | Braat et al. |
| 6,392,825 B1 | 5/2002 | Trunz et al. |
| 6,405,533 B1 | 6/2002 | Rastegar et al. |
| 6,411,368 B1 | 6/2002 | Matsumoto et al. |
| 6,411,426 B1 | 6/2002 | Meehan et al. |
| 6,428,173 B1 | 8/2002 | Dhuler et al. |
| 6,445,515 B2 | 9/2002 | Moennig |
| 6,445,516 B2 | 9/2002 | Osterried |
| 6,449,106 B1 | 9/2002 | Spinali |
| 6,466,380 B2 | 10/2002 | Bischoff |
| 6,469,827 B1 * | 10/2002 | Sweatt et al. ............... 359/351 |
| 6,473,247 B1 | 10/2002 | Keller et al. |
| 6,478,434 B1 | 11/2002 | Streetman et al. |
| 6,496,466 B1 | 12/2002 | Lee et al. |
| 6,501,605 B2 | 12/2002 | Moriya |
| 6,503,383 B1 | 1/2003 | Holderer et al. |
| 6,509,670 B2 | 1/2003 | Jeong et al. |
| 6,521,892 B2 | 2/2003 | Emanuel et al. |
| 6,537,479 B1 | 3/2003 | Colea |
| 6,538,829 B2 | 3/2003 | Rau et al. |
| 6,539,142 B2 * | 3/2003 | Lemoff et al. ................ 385/18 |
| 6,549,692 B1 * | 4/2003 | Harel et al. .................... 385/18 |
| 6,552,862 B2 | 4/2003 | Dieker |
| 6,560,384 B1 * | 5/2003 | Helkey et al. ................ 385/18 |
| 6,566,627 B2 | 5/2003 | Brandinger et al. |
| 6,580,570 B2 | 6/2003 | Becker et al. |
| 6,585,379 B2 | 7/2003 | Yokoyama et al. |
| 6,594,057 B1 | 7/2003 | Drake et al. |
| 6,594,093 B2 | 7/2003 | Moeller et al. |
| 6,603,615 B2 | 8/2003 | Melzer et al. |
| 6,614,504 B2 | 9/2003 | Aoki |
| 6,628,371 B1 | 9/2003 | Ishikawa |
| 6,633,107 B1 | 10/2003 | Calabro et al. |
| 6,646,713 B2 | 11/2003 | Ishii |
| 6,653,887 B2 | 11/2003 | Haeusser-Boehm et al. |
| 6,658,084 B2 * | 12/2003 | Singer ......................... 378/34 |
| 6,667,255 B2 | 12/2003 | Hexels |
| 6,667,839 B2 | 12/2003 | Hartmaier et al. |
| 6,717,742 B2 | 4/2004 | Weber |
| 6,727,984 B2 | 4/2004 | Becht |
| 6,729,062 B2 | 5/2004 | Thomas et al. |
| 6,733,369 B1 | 5/2004 | Stacklies et al. |
| 6,768,567 B2 * | 7/2004 | Naulleau ..................... 359/15 |
| 6,768,600 B2 | 7/2004 | Dieker |
| 6,791,768 B2 | 9/2004 | Rau |
| 6,798,494 B2 * | 9/2004 | Naulleau ..................... 355/67 |
| 6,798,588 B2 | 9/2004 | Vogt |
| 6,816,325 B1 | 11/2004 | Becker et al. |
| 6,825,914 B2 | 11/2004 | Schroeder et al. |
| 6,829,107 B2 | 12/2004 | Osterried |
| 6,844,994 B2 | 1/2005 | Melzer et al. |
| 6,853,440 B1 * | 2/2005 | Van De Pasch et al. ....... 355/53 |
| 6,870,554 B2 * | 3/2005 | Jain ......................... 345/697 |
| 6,964,485 B2 * | 11/2005 | Singer et al. ............... 359/850 |
| 2002/0021903 A1 | 2/2002 | Ito et al. |
| 2002/0163741 A1 | 11/2002 | Shibazaki |
| 2002/0167740 A1 | 11/2002 | Osterried et al. |
| 2002/0176094 A1 | 11/2002 | Petasch et al. |
| 2004/0119961 A1 * | 6/2004 | Singer et al. ................. 355/67 |
| 2004/0232354 A1 * | 11/2004 | Singer et al. ............. 250/492.2 |

FOREIGN PATENT DOCUMENTS

| | | |
|---|---|---|
| DE | 199 03 807 A1 | 11/1999 |
| DE | 100 15 953 | 10/2000 |
| DE | 199 36 568 A1 | 2/2001 |
| DE | 100 53 587 A1 | 5/2002 |
| DE | 101 20 446 A1 | 11/2002 |
| EP | 0 939 341 A2 | 2/1999 |
| EP | 0 939 341 A3 | 2/1999 |
| EP | 1 026 547 A2 | 1/2000 |
| WO | WO86 05281 | 9/1986 |
| WO | WO99 66542 | 12/1999 |

OTHER PUBLICATIONS

Ellis, "Low-cost Bimorph Mirrors in Adaptice Optics," Imperial College of science, Technology & Medicine, University of London, 1999.

Sato et al., Adaptive PVDF piezoelectric deformable mirror system, Applied Optics, vol. 19, No. 9, 1980, pp. 1430-1434.

Sato et al., "Multilayered deformable mirror using PVDF films," Applied Optics, vol. 21, No. 20, 1982, pp. 3664-3668.

Sato et al., "Transmission-type PVDF 2-D optical phase modulator," Applied Optics, vol. 20, No. 2, 1981, pp. 343-350.

Ro et al., "Vibration Control if Plates Using Self-Sensing Active Constrained Layer Damping," SPIE vol. 3672, 1999, pp. 200-209.

Krug et al., Application of a 6×8 Silicon APD Array and Hybrid Electronics for Scannerless 3D Imaging Ladar, NATO/IRIS Active Systems, 1995, vol. II, pp. 79-89.

Burns et al., "Compact, Multichannel receiver using InGaAs APDs for single pulse, eye,-safe, laser radar imagery," SPIE vol. 3065, 1997, pp. 22-29.

Schulz et al., "Calibration of an interferometer for testing cylindrical surfaces," 1995 Elsevier Science, pp. 512-520.

\* cited by examiner

*Primary Examiner*—Loha Ben
(74) *Attorney, Agent, or Firm*—Wells St. John, P.S.

(57) ABSTRACT

A lighting system, particularly for use in extreme ultraviolet (EUV) lithography, comprising a projection lens for producing semiconductor elements for wavelengths $\leq 193$ nm is provided with a light source, an object plane, an exit pupil, a first optical element having first screen elements for producing light channels, and with a second optical element having second screen elements. A screen element of the second optical element is assigned to each light channel that is formed by one of the first screen elements of the first optical element. The screen elements of the first optical element and of the second optical element can be configured or arranged so that they produce, for each light channel, a continuous beam course from the light source up to the object plane. The angles of the first screen elements of the first optical element can be adjusted in order to modify a tilt. The location and/or angles of the second screen elements of the second optical element can be adjusted individually and independently of one another in order to realize another assignment of the first screen elements of the first optical element to the second screen elements of the second optical element by displacing and/or tilting the first and second screen elements.

27 Claims, 6 Drawing Sheets

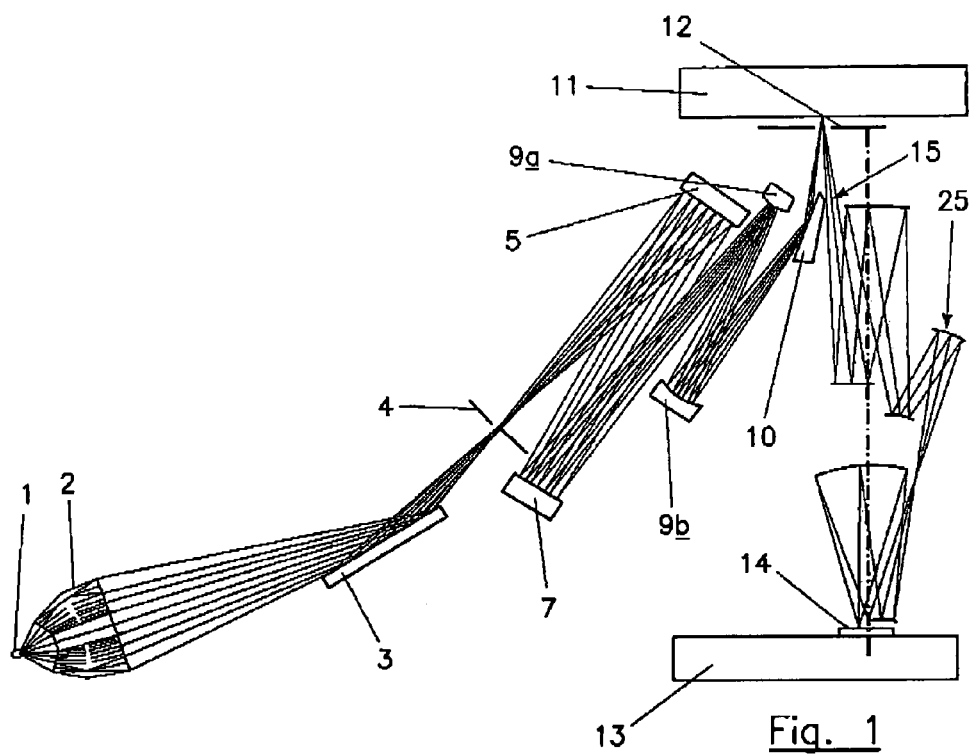
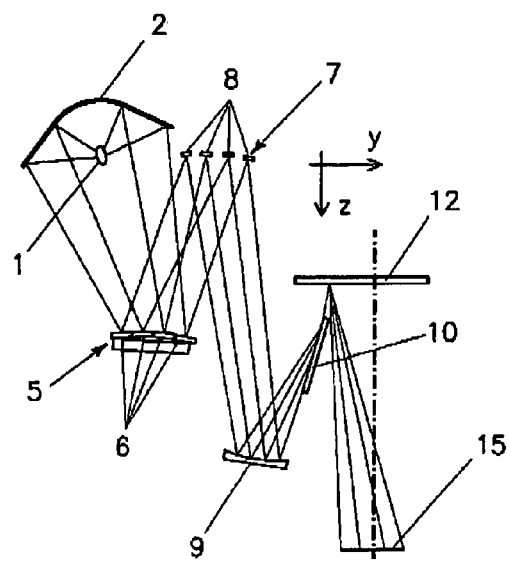
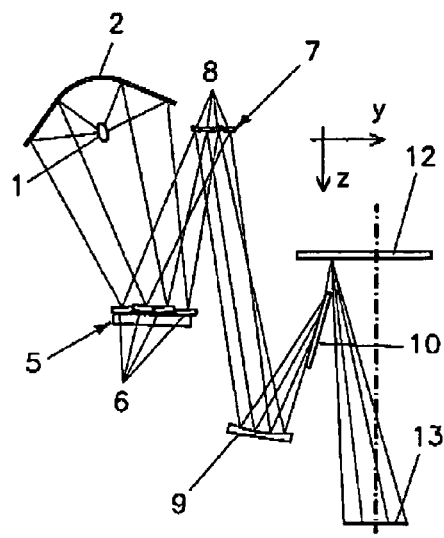
Fig. 1
Fig. 2
Fig. 3

LIGHTING SYSTEM, PARTICULARLY FOR USE IN EXTREME ULTRAVIOLET (EUV) LITHOGRAPHY

CROSS REFERENCE TO RELATED APPLICATION

This application is a 35 U.S.C. §371 of and claims priority to PCT International Application Number PCT/EP 03/003616, which was filed 08 Apr. 2003 (08.04.03), and was published in German which was based on German Patent Application No. 102 19 514.5 which was filed 30 Apr. 2002 (30.04.02) and the teachings of which are incorporated herein by reference.

The invention relates to a lighting system, in particular for extreme ultraviolet (EUV) lithography, comprising a projection objective for producing semiconductor elements for wavelengths $\leq 193$ mm, a light source, an object plane, an exit pupil, the first optical element having first grid elements for producing optical channels and the second optical element having second grid elements, each optical channel which is formed by one of the first grid elements of the first optical element being assigned a grid element of the second optical element, it being possible for grid elements of the first optical element and of the second optical element to be configured in such a way or arranged in such a way that the result for each optical channel is a continuous beam course from the light source as far as the object plane.

The invention also relates to a projection exposure installation having such a lighting system.

In order to reduce the structure widths of electronic components, in particular of semiconductor components, the wavelength for the light used for the microlithography should be reduced further and further. At present, wavelengths of $\leq 193$ nm are already used in lithography.

Here, a lighting system suitable for EUV Lithography should illuminate the field predefined for the EUV lithography, in particular the annular field of an objective, homogeneously, that is to say uniformly, with as few reflections as possible. In addition, the pupil of the objective should be illuminated independently of the field as far as a specific filling level σ, and the exit pupil of the lighting system should lie in the entry pupil of the objective.

With regard to the general prior art, reference is made to U.S. Pat. Nos. 5,339,346, 5,737,137, 5,361,292 and 5,581,605.

EP 0 939 341 shows a lighting system for the EUV range having a first optical integrator, which has a large number of first grid elements, and a second optical integrator, which has a large number of second grid elements. In this case, the distribution of the illumination in the exit field is controlled via a stop wheel. However, the use of a stop wheel entails considerable light losses. Further solutions proposed, such as a quadrupole illumination distribution and illumination systems that can be used differently via interchangeable optics are, however, firstly very complex and secondly restricted to specific types of illumination.

DE 199 03 807 A1 describes an EUV lighting system which, inter alia, comprises two mirrors having grid elements. Systems of this type are also designated double-facetted EUV lighting systems. The illumination of the exit pupil is in this case determined by the arrangement of the grid elements on the second mirror. The illumination in the exit pupil or an illumination distribution is in this case defined.

In the earlier German patent application 100 53 587.9 a lighting system is described, it being possible for a pre-defined illumination pattern to be set in the exit pupil of the lighting system by means of appropriate associations between the grid elements of the first and of the second optical element. Using a lighting system of this type, the field in the reticle plane can be illuminated homogeneously and with a partially filled aperture, and also the exit pupil of the lighting system can be illuminated in a variable manner. The variable setting of any desired illumination distribution in the exit pupil is in this case carried out largely without light losses.

The present invention is based on the object of providing a lighting system with which the basic idea of the earlier patent application can be implemented in practice by means of constructional solutions.

According to the invention, this object is achieved in that the angles of the first grid elements of the first optical element can be adjusted in order to modify a tilt. In addition, the location and/or angle of the second grid elements of the second optical element can also be adjusted individually and independently of one another, in order, by means of displacing and/or tilting the first and second grid elements, to implement a different assignment of the first grid elements of the first optical element to the second grid elements of the second optical element.

By means of appropriate displacement and/or tilting of the grid elements, optical channels in variable configurations can now be achieved.

In order that the individual bundles of rays of field honeycombs as grid elements in the field overlap again, pupil honeycombs as grid elements can be inclined or tilted appropriately in relation to a pupil honeycomb plate or the mirror support of the latter. Mirror facets are particularly suitable as field honeycombs and as pupil honeycombs.

If, in this case, the system is built up as a system having real intermediate images of the light source after the field honeycomb plate or the mirror support of the first optical element, then the pupil honeycombs can be used at the same time as field lenses for the coupled projection of the light source into the entry pupil of the lithography objective or projection objective.

If, in an advantageous refinement of the invention, the number M of second grid elements (pupil honeycombs) of the pupil honeycomb plate or the mirror support is always greater than N, where N is the number of channels, which is determined by the number of illuminated first grid elements (field honeycombs), variable illumination patterns can be presented in the exit pupil. In other words: in this case, more pupil honeycombs or mirror facets will be provided on the second optical element than would be necessary for the number of optical channels produced by the first grid elements of the first optical element. Given a specific setting with a specific field honeycomb having N channels, in each case only some of the pupil honeycombs are thus illuminated. This therefore leads to segmented or parceled illumination of the pupil honeycombs.

Further advantageous refinements and developments of the invention emerge from the remaining subclaims and from the following exemplary embodiments described in principle by using the drawing, in which:

FIG. 1 shows a structure of an EUV lighting system having a light source, a lighting system and a projection objective;

FIG. 2 shows a basic sketch of the beam path having two mirrors with grid elements in the form of mirror facets and a collector unit;

FIG. 3 shows a basic sketch of another beam path having two mirrors with grid elements in the form of mirror facets and a collector unit;

Figure 4:
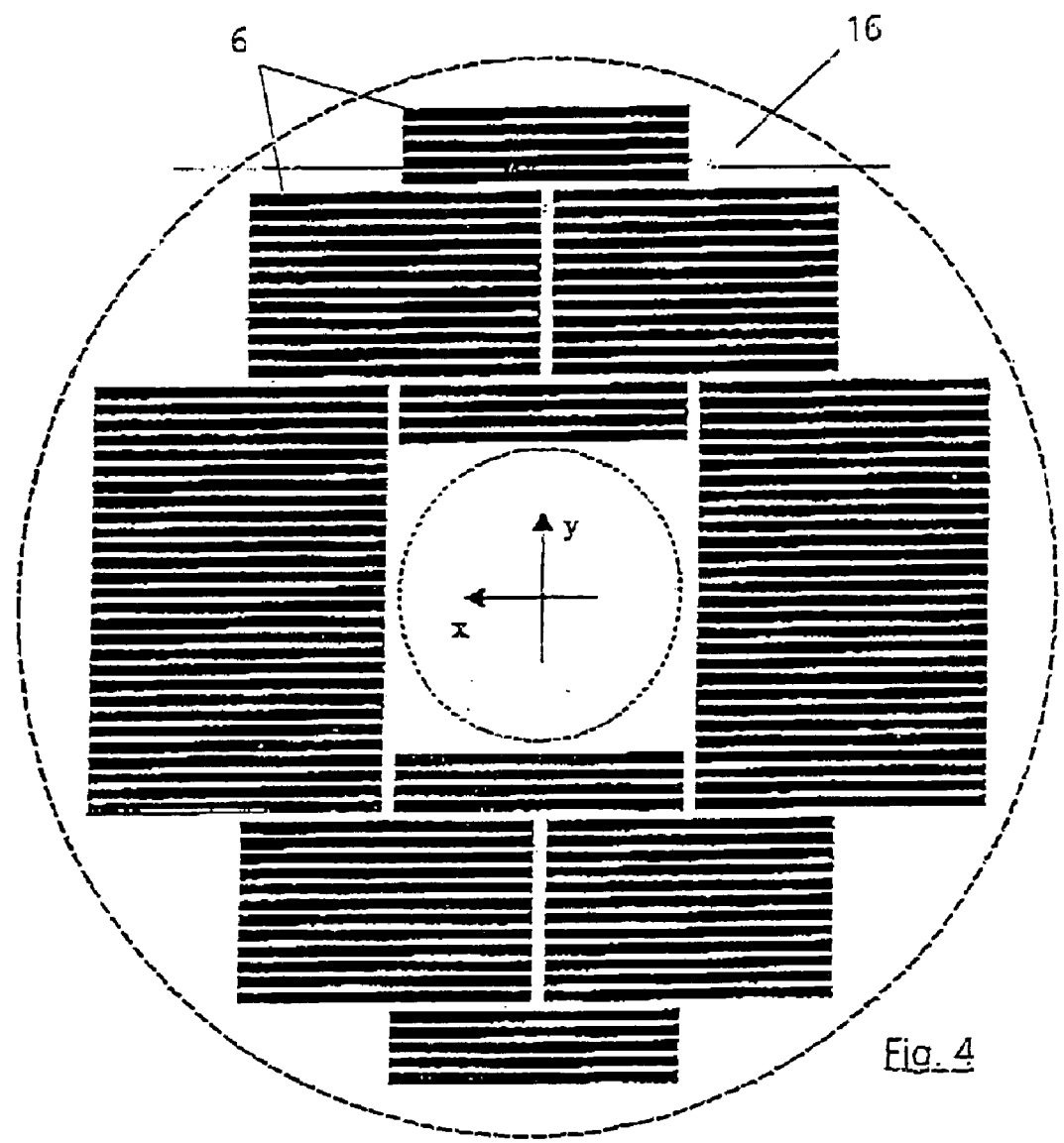
FIG. 4 shows a plan view of the first optical element in the form of a field honeycomb plate (mirror support) having a large number of mirror facets.

FIG. 1 shows in a general illustration an EUV projection lighting installation having a complete EUV lighting system comprising a light source 1, for example a laser-plasma, plasma or pinch-plasma source or else another EUV light source, and a projection objective 25 illustrated merely in principle. Apart from the light source 1, there are arranged in the lighting system a collector mirror 2 which, for example, can comprise a plurality of shells arranged in one another, a planar mirror 3 or reflective spectral filter, an aperture stop 4 with an image of the light source (not designated), a first optical element 5 having a large number of facet mirrors 6 (see FIGS. 2 and 3), a second optical element 7 arranged thereafter and having a large number of grid elements 8 in the form of facet mirrors, and two projection mirrors 9a and 9b. The projection mirrors 9a and 9b are used to project the facet mirrors 8 of the second optical element 7 into an entry pupil of the projection objective 25. The reticle 12 can be moved in the y direction as a scanning system. The reticle plane 11 also simultaneously constitutes the object plane.

In order to provide different optical channels for adjusting the setting in the bean path of the lighting system, for example there is a larger number M of mirror facets 8 of the second optical element 7 than corresponds to the number N of the mirror facets 6 of the first optical element 5. In FIG. 1, the mirror facets are not illustrated, for reasons of clarity. The angles of the mirror facets 6 of the first optical element 5 can in each case be adjusted individually, while both the angles and the locations of the mirror facets 8 of the second optical element 7 can be adjusted. In FIGS. 7 to 14, explained in the following text, details relating to this are described and illustrated. As a result of the tiltable arrangement and the ability to displace the mirror facets 6 and 8, different beam paths and thus different optical channels can be created between the first optical element 5 and the second optical element 7.

The following projection objective 25 can be constructed as a six-mirror projection objective. A wafer 14 is located on a carrier unit 13 as the object to be exposed.

As a result of the ability to adjust the mirror facets 6 and 8, different settings can be implemented in an exit pupil 15 of the lighting system which, at the same time, forms an entry pupil of the projection objective 25.

In FIGS. 2 and 3, optical channels which are different in principle are illustrated by means of different layers and angles of the mirror facets 6 and 8 of the two optical elements 5 and 7. The lighting system is in this case indicated in simplified form as compared with the illustration in FIG. 1 (for example with respect to the position of the optical elements 5 and 7 and with only one projection mirror 9).

In this case, the illustration in FIG. 2 shows a greater filling factor σ.

For σ=1.0, the objective pupil is filled completely; σ=0.6 accordingly denotes underfilling.

In FIGS. 2 and 3, the beam path from the light source 1 via the reticle 12 as far as the exit pupil 15 is illustrated.

FIG. 4 shows a plan view of a mirror support 16 of the first optical element 5 having a large number of grid elements in the form of mirror facets 6. The illustration shows 142 individually adjustable mirror facets 6 as field honeycombs in rectangular form, which are arranged in blocks in a region illuminated by the nested collector mirror 2. The angles of the mirror facets 6 can in each case be adjusted individually. The facets 8 of the second optical element 7 can additionally be displaced among themselves and, if required, also independently of one another.

Figure 5:
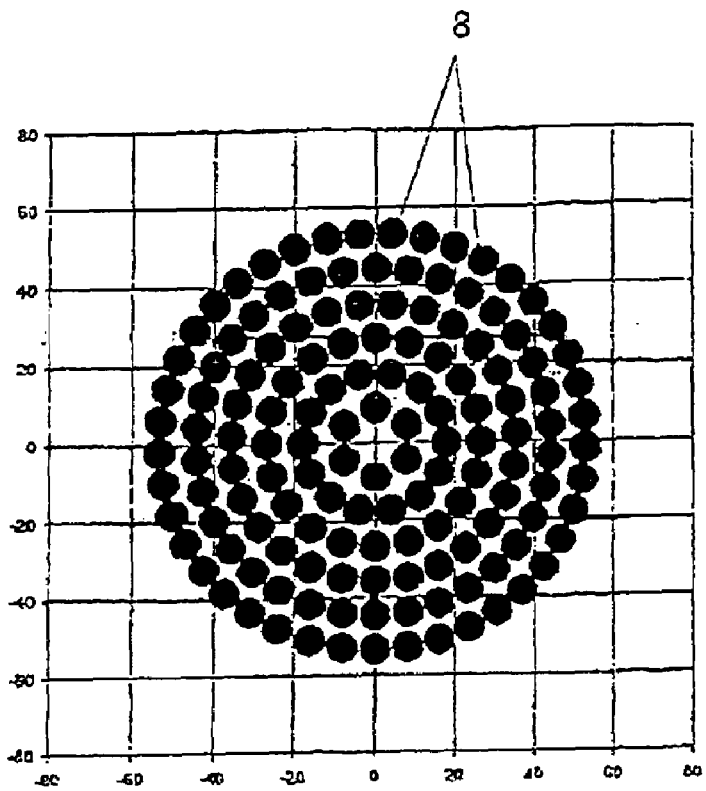
FIG. 5 shows a plan view of the second optical element in the form of a pupil honeycomb plate as mirror support having a large number of mirror facets with circular illumination.

FIG. 5 shows a plan view of a mirror support 16 or pupil honeycomb plate of the second optical element 7, the optical channels resulting in a circular setting.

Figure 6:
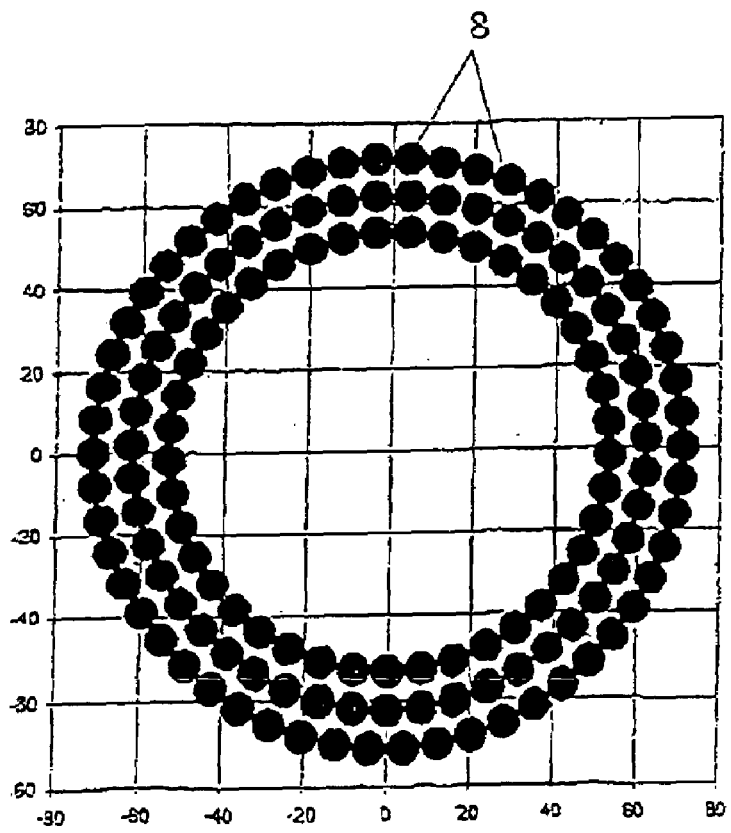
FIG. 6 shows a plan view of the second optical element in the form of a pupil honeycomb of plate having a large number of mirror facets with annular illumination.

FIG. 6 shows a plan view of a mirror support 16 of the second optical element 7 having mirror facets in an annular setting. A further possibility consists in a known quadrupole setting (not illustrated). In FIGS. 5 and 6, the illuminated mirror facets are in each case illustrated dark.

Figure 7:
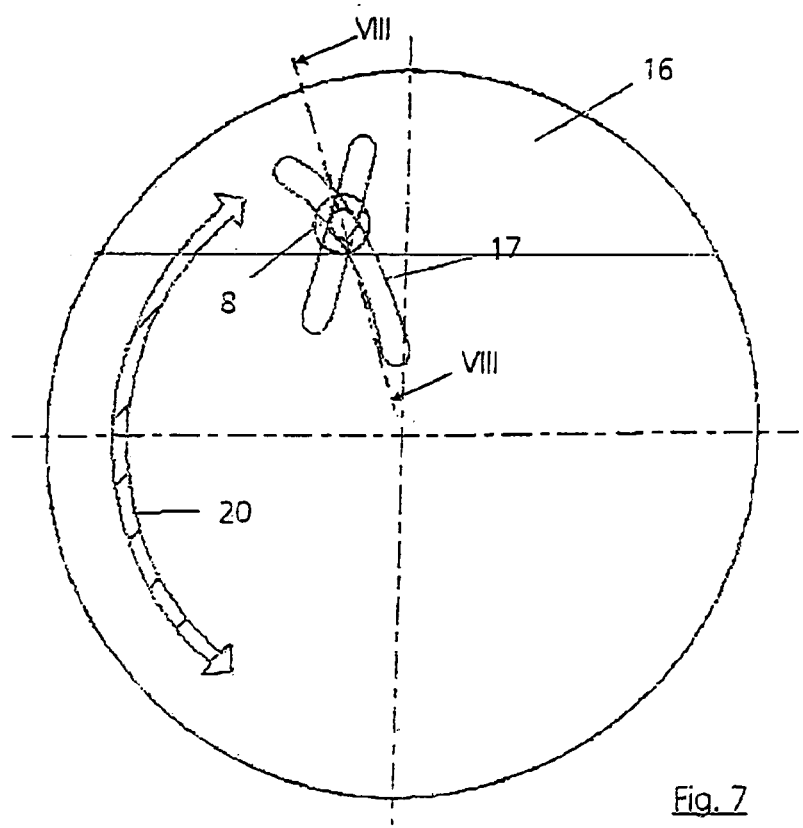
FIG. 7 shows a plan view of a pupil honeycomb plate.
Figure 8:
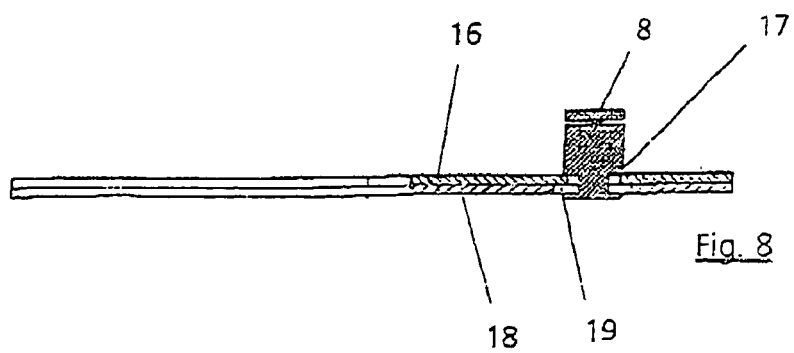
FIG. 8 shows a section along the line VIII—VIII from FIG. 7.

FIG. 7 shows a plan view of the mirror support 16 of the second optical element 7, the mirror support 16 being formed as a guide disk. The mirror support 16 or the guide disk is provided with a large number of guide grooves (only one guide groove 17 is illustrated in FIG. 7, for reasons of clarity), in which a circular mirror facet 8 is guided in each case. The guide groove 17 runs essentially radially or in slightly curved form for this purpose. The course of the guide grooves 17 depends on the respective application and on the desired displacement direction of the mirror facets 8.

Underneath the mirror support 16 or the guide disk, parallel to and resting thereon, there is arranged a control disk 18, which is likewise provided with a number of control grooves 19 corresponding to the guide grooves 17 and therefore to the mirror facets 8. Each mirror facet 8 is thus guided in a guide groove 17 and in a control groove 19. If the control disk 18 is moved in the direction of the arrow 20 in FIG. 7 by means of a drive device, not illustrated, then the mirror facets 8 are moved radially inward or outward along the guide groove 17. As a result of this displacement, the assignments of the optical channels and therefore the illumination change. This means that, by rotating the control disk 18 relative to the guide disk 16, the associated mirror facet 8 at the point of intersection of the two grooves 17 and 19 is displaced along the associated guide groove 17.

Figure 9:
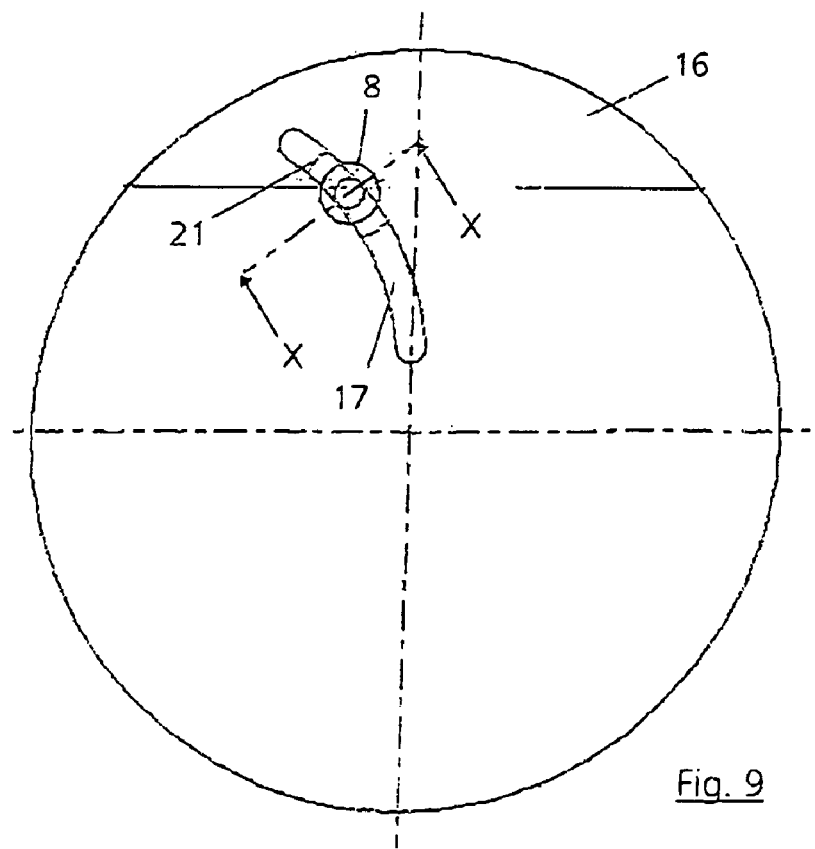
FIG. 9 shows a plan view of a pupil honeycomb plate which is constructed as a control disk.
Figure 10:
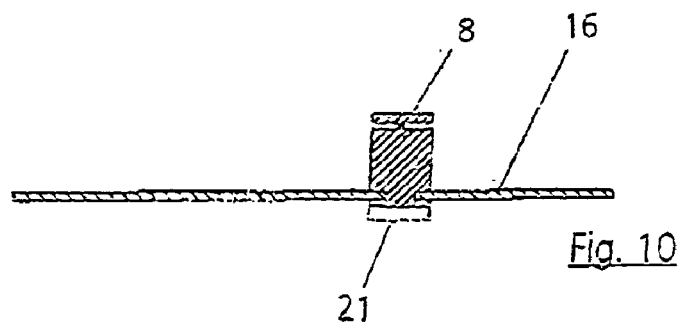
FIG. 10 shows a section along the line X—X from FIG. 9.

FIGS. 9 and 10 show a refinement for the displacement of the mirror facets 8 of the second optical element 7 respectively in a guide groove 17 of the mirror support 16, in each case a drive device 21 being provided (illustrated only in principle and dashed in FIGS. 9 and 10). In this case, each mirror facet 8 has its own drive in the associated guide groove 17, it being possible for the drive to be provided, for example, in accordance with the known piezoelectric inchworm principle.

Of course, for this purpose, other drive devices by means of which the mirror facets 8 can be adjusted individually in each case are also possible. Instead of arranging the drive device in each case directly in a guide groove 17, if required these can of course also be arranged independently thereof underneath or behind the mirror support 16.

Figure 11:
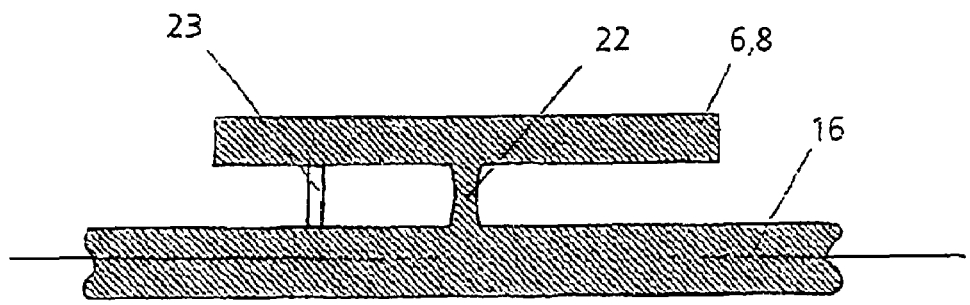
FIG. 11 shows an enlarged illustration in section of a mirror facet having a solid body joint.
Figure 12:
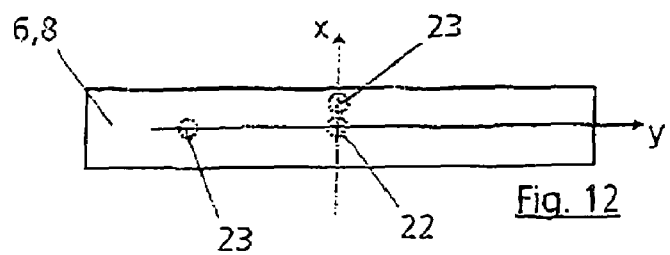
FIG. 12 shows a plan view of the mirror facet according to FIG. 11.

FIGS. 11 and 12 illustrate in section and in plan view an enlarged illustration of a mirror facet 6 of the first optical element 5, which is connected to the mirror support 16 of the first optical element 5 by a joint 22, which is formed as a solid body joint. In this case, all the parts can be in one piece or each mirror facet 6 has a central web as a joint 22, via which the connection is made to the mirror support 16 located underneath.

By means of actuators 23, not specifically illustrated, which are located between the mirror support 16 and the underside of each mirror facet 6, each mirror facet 6 can be tilted with respect to the mirror support 16. The plan view according to FIG. 12 reveals that tilting possibilities in both directions are provided by an actuator 23 which is located on the y axis and a further actuator 23 which is located on the x axis. In this case, the two actuators 23 are in each case located on the axis assigned to them outside the point of intersection of the axes.

Since the adjustment or tilting of each mirror facet 6 is carried out only to a very small extent, piezoceramic elements, for example, can be used as actuators 23.

Figure 13:
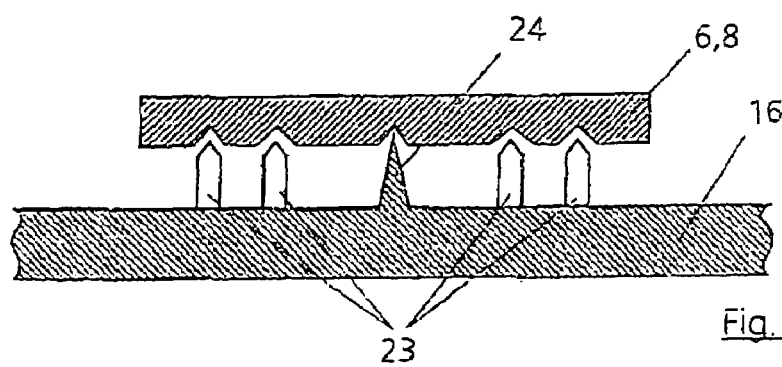
FIG. 13 shows an enlarged illustration in section of a mirror facet having another type of mounting.
Figure 14:
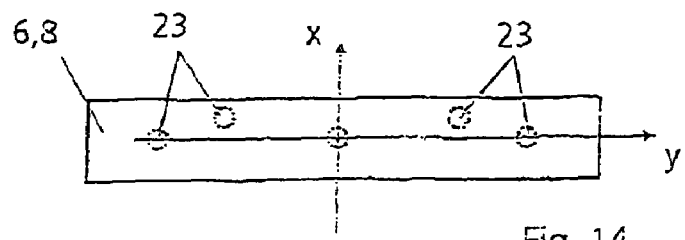
FIG. 14 shows a plan view of the mirror facet according to FIG. 13.

FIGS. 13 and 14 illustrate a refinement by means of which larger tilts for the mirror facets 6 are made possible. As can be seen from FIG. 13, in this case there is a central tilting joint or tilting bearing 24 between the mirror facet 6 and the mirror support 16. Here, too, actuators 23 ensure that the mirror facets 6 are tilted both in the x direction and in the y direction. For this purpose, in this case there are two actuators 23 arranged at a distance from each other on the y axis outside the point of intersection of the two axes, and two further actuators 23 outside the y axis on both sides at the same distance from the x axis (see FIG. 14).

By means of the tilting devices illustrated in FIGS. 11 to 14, t is possible to adjust not only the mirror facets 6 of the first optical element 5 but also the mirror facets 8 of the second optical element 7 as desired and independently of one another.

As distinct from the mirror facets 6 of the first optical element 5, which have an elongated or narrow rectangular form, the mirror facets 8 of the second optical element 7 have a circular form. However, this difference has no influence on the type or mode of action of the tilting devices illustrated in FIGS. 11 to 14.

In principle, the mirror facets 6 of the first optical element can likewise be displaced in the same way as illustrated in FIGS. 7 to 10 but, in practice, this will generally not be necessary; instead, pure tilting adjustments will as a rule be sufficient.

Actuating elements that can be activated magnetically or electrically are also possible as actuators 23. The actuators 23 can in this case adjust the mirror facets 6 and 8 continuously via a control loop (not illustrated). Likewise, it is also possible for the actuators to define end positions, with which in each case two exact tilted positions are predefined for the mirror facets 6 and 8.

The invention claimed is:

1. A lighting system, in particular for EUV lithography, comprising a projection objective for producing semiconductor elements for wavelengths $\leqq 193$ nm, a light source, an object plane, an exit pupil, a first optical element having first grid elements for producing optical channels and a second optical element having second grid elements, each optical channel which is formed by one of the first grid elements of the first optical element being assigned a grid element of the second optical element, it being possible for grid elements of the first optical element and of the second optical element to be configured in such a way or arranged in such a way that the result for each optical channel is a continuous beam course from the light source as far as the object plane, characterized in that the angles of the first grid elements of the first optical element can be adjusted in order to modify a tilt in order, by means of tilting the first grid elements, to implement a different assignment of the first grid elements of the first optical element to the second grid elements of the second optical element.

2. The lighting system as claimed in claim 1, characterized in that the number M of second grid elements of the second optical element is greater than the number N of first grid elements of the first optical element.

3. The lighting system as claimed in claim 1 or 2, characterized in that the location and/or the angle of the second grid elements of the second optical element can be adjusted individually and independently of one another in order, by means of displacement and/or tilting of the first and second grid elements, to implement a different assignment of the first grid elements of the first optical element to the second grid elements of the second optical element.

4. The lighting system as claimed in claim 3, characterized in that the first grid elements are formed as field honeycombs in the form of first mirror facets, and in that the second grid elements are formed as pupil honeycombs in the form of second mirror facets, the first mirror facets and the second mirror facets in each case being arranged on a mirror support.

5. The lighting system as claimed in claim 4, characterized in that the optical channels between the mirror facets of the first and the second optical element can be adjusted by tilting the first mirror facets of the first optical element in relation to the mirror support, in order in this way to implement different assignments of the first mirror facets of the first optical element to the second mirror facets of the second optical element and therefore different illumination patterns of an exit pupil.

6. The lighting system as claimed in claim 4 or 5, characterized in that the optical channels between the first mirror facets of the first optical element and the second mirror facets of the second optical element can be adjusted by tilting and displacing the second mirror facets of the second optical element in relation to the mirror support.

7. The lighting system as claimed in claim 4, characterized in that the mirror facets of the first optical element and/or of the second optical element are in each case connected to the associated mirror support via a joint.

8. The lighting system as claimed in claim 7, characterized in that the joints are formed as solid body joints.

9. The lighting system as claimed in claim 7 or 8, characterized in that the mirror facets can be tilted in the x direction and/or in the y direction.

10. The lighting system as claimed in claim 9, characterized in that the joints are in each case located on the x axis and/or the y axis of the mirror facets.

11. The lighting system as claimed in claim 4, characterized in that, in order to displace and/or tilt the mirror facets, actuators are arranged between the grid elements and the mirror support.

12. The lighting system as claimed in claim 11, characterized in that the actuators have piezoceramic adjusting elements.

13. The lighting system as claimed in claim 12, characterized in that the actuators are provided with actuating elements that can be activated magnetically or electrically.

14. The lighting system as claimed in claim 11, characterized in that the actuators adjust the grid elements continuously via a control loop.

15. The lighting system as claimed in claim 11, characterized in that end positions are defined for the actuators.

16. The lighting system as claimed in claim 4, characterized in that the mirror facets can be displaced on predefined paths.

17. The lighting system as claimed in claim 16, characterized in that cam tracks, in which the mirror facets are guided individually in each case, are introduced into the mirror support.

18. The lighting system as claimed in claim 17, characterized in that the mirror support is formed as a guide disk, which interacts with a control disk, in which there are arranged guide tracks for the displacement of the mirror facets.

19. The lighting system as claimed in claimed 18, characterized in that the control disk is driven.

20. The lighting system as claimed in claimed 17, characterized in that each mirror facet is guided in a cam track in the mirror support, and in that each mirror facet can be driven individually by a drive element.

21. The lighting system as claimed in claim 20, characterized in that the drive element is in each case arranged in a cam track and each mirror facet is moved individually in accordance with the inch-worm principle.

22. A projection exposure installation for microlithography for producing semiconductor elements, comprising a lighting system and comprising a projection objective for producing semiconductor elements for wavelengths ≦193 nm, a light source, an object plane, an exit pupil, a first optical element having first grid elements for producing optical channels and a second optical element having second grid elements, each optical channel which is formed by one of the first grid elements of the first optical element being assigned a grid element of the second optical element, it being possible for grid elements of the first optical element and of the second optical element to be configured in such a way or arranged in such a way that the result for each optical channel is a continuous beam course from the light source as far as the object plane, characterized in that the angles of the first grid elements of the first optical element can be adjusted in order to modify a tilt in order, by means of tilting the first grid elements, to implement a different assignment of the first grid elements of the first optical element to the second grid elements of the second optical element.

23. The projection exposure installation as claimed in claim 22, characterized in that the number M of second grid elements of the second optical element is greater than the number N of first grid elements of the first optical element.

24. The projection exposure installation as claimed in claim 22 or 23, characterized in that the location and/or the angle of the second grid elements of the second optical element can be adjusted individually and independently of one another in order, by means of displacement and/or tilting of the first and second grid elements, to implement a different assignment of the first grid elements of the first optical element to the second grid elements of the second optical element.

25. The projection exposure installation as claimed in claim 24, characterized in that the first grid elements are formed as field honeycombs in the form of first mirror facets, and in that the second grid elements are formed as pupil honeycombs in the form of second mirror facets, the first mirror facets and the second mirror facets in each case being arranged on a mirror support.

26. The projection exposure installation as claimed in claim 25, characterized in that the optical channels between the mirror facets of the first and the second optical element can be adjusted by tilting the mirror facets of the first optical element in relation to the mirror support, in order in this way to implement different assignments of the first mirror facets of the first optical element to the second mirror facets of the second optical element and therefore different illumination patterns of an exit pupil.

27. The projection exposure installation as claimed in claim 25 or 26, characterized in that the optical channels between the first mirror facets of the first optical element and the second mirror facets of the second optical element can be adjusted by tilting and displacing the second mirror facets of the second optical element in relation to the mirror support.

* * * * *

UNITED STATES PATENT AND TRADEMARK OFFICE
CERTIFICATE OF CORRECTION

PATENT NO. : 7,196,841 B2
APPLICATION NO. : 10/512100
DATED : March 27, 2007
INVENTOR(S) : Frank Melzer et al.

It is certified that error appears in the above-identified patent and that said Letters Patent is hereby corrected as shown below:

Col. 1, line 18 –
　Replace "wavelengths $\leqq 193$ mm, a light source, an object plane, an"
　With --wavelengths $\leqq 193$ nm, a light source, an object plane, an--

Col. 3, line 50 –
　Replace "the setting in the bean path of the lighting system, for"
　With --the setting in the beam path of the lighting system, for--

Col. 5, line 43 –
　Replace "14, t is possible to adjust not only the mirror facets 6 of the"
　With --14, it is possible to adjust not only the mirror facets 6 of the--

Col. 7, line 24, claim 19 –
　Replace "The lighting system as claimed in claimed 18,
　With --The lighting system as claimed in claim 18--

Col. 7, line 26, claim 20 –
　Replace "The lighting system as claimed in claimed 17,
　With --The lighting system as claimed in claim 17--

Signed and Sealed this

Thirty-first Day of July, 2007

JON W. DUDAS
*Director of the United States Patent and Trademark Office*